United States Patent [19]

Kawagoe

[11] 3,825,888

[45] July 23, 1974

[54] DECODER CIRCUIT

[75] Inventor: Hiroto Kawagoe, Tokyo, Japan

[73] Assignee: Hitachi, Ltd., Tokyo, Japan

[22] Filed: June 23, 1972

[21] Appl. No.: 265,475

[30] Foreign Application Priority Data

June 23, 1971 Japan .............................. 46-44791

[52] U.S. Cl. ...... 340/347 DD, 340/166 R, 307/205, 307/215, 307/251

[51] Int. Cl. ............................................. H041 3/00

[58] Field of Search... 340/347 DD, 166 EE, 166 R; 307/205, 215, 251

[56] References Cited

UNITED STATES PATENTS

| | | | |
|---|---|---|---|
| 3,355,598 | 11/1967 | Tuska | 307/251 X |
| 3,356,858 | 12/1967 | Wanlass | 307/205 |
| 3,500,062 | 3/1970 | Annis | 307/205 X |
| 3,539,823 | 11/1970 | Zuk | 340/347 DD X |
| 3,541,353 | 11/1970 | Seelbach et al. | 307/205 X |
| 3,541,543 | 11/1970 | Crawford et al. | 307/205 X |
| 3,631,465 | 5/1971 | Heeren | 340/347 DD |
| 3,653,034 | 3/1972 | Regitz | 340/347 DD |
| 3,679,911 | 7/1972 | Kaufman | 307/251 |
| 3,717,868 | 2/1973 | Crawford et al. | 340/347 DD |

*Primary Examiner*—Charles D. Miller
*Attorney, Agent, or Firm*—Craig & Antonelli

[57] ABSTRACT

A decoder circuit with a matrix of MIS transistors wherein a first group of MIS transistors are provided between a potential supply source line and output leads, the transistors of the first group are connected in series, a second group of MIS transistors are provided between a ground line and the output leads, the transistors of the second group are connected in parallel, and gate electrodes of the first and second groups of transistos are connected directly to or indirectly through inverters to address input lines with a predetermined pattern in order to obtain desired output signals.

4 Claims, 4 Drawing Figures

PATENTED JUL 23 1974 3,825,888

SHEET 1 OF 2

DECODER CIRCUIT

The present invention relates to a decoder circuit comprising a matrix of metal insulated gate type field effect transistors (MIST) which drives a semiconductor memory apparatus.

In a conventional decoder circuit using MISTs an output signal is obtained by the current flowing through a high resistance load or by the voltage generated at a terminal of the high resistance load. In such a conventional decoder circuit it has been very difficult to obtain a high response speed since the response speed depends on the high resistance load. The conventional decoder circuit has the disadvantage in that increased power consumption is necessary in order to obtain a high response speed. Also, it has another disadvantage that it occupies a large area due to the high resistance load when all of the circuit elements are formed in a sheet of semiconductor body as an integrated circuit device.

An object of the present invention is to provide an improved decoder circuit.

Another object of the present invention is to provide a decoder circuit having a high response speed or operating with high speed.

A further object of the present invention is to provide a decoder circuit operating with low power consumption.

A decoder circuit according to the present invention comprises a semiconductor decoder circuit using MIS transistors wherein a plurality of predetermined MIS transistors are connected between a voltage supplying line or earth line and address lines or inverted address lines to obtain desired output signals without using load resistors.

The above-mentioned objects, features and advantages of the present invention will be more specifically explained in conjunction with the attached drawings, wherein.

Figure 1:
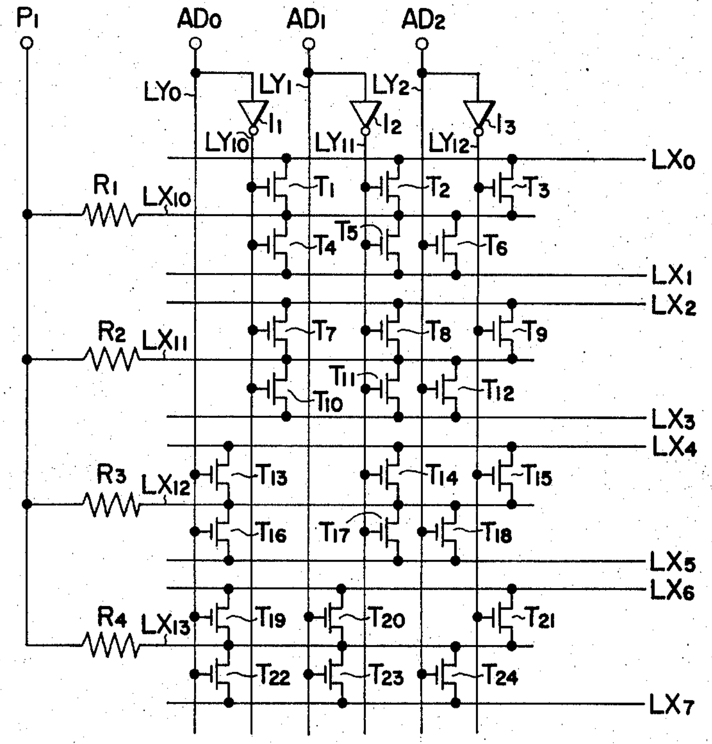
FIG. 1 PRIOR ART
FIG. 1 shows a circuit diagram of a conventional decoder circuit.

FIG. 1 shows a conventional decoder circuit wherein $T_1$ to $T_{24}$ are MIS transistors; $I_1$ to $I_3$ are inverters, $R_1$ to $R_4$ are high resistance loads; $LX_0$ to $LX_7$ are a first group of output leads connected to the output electrodes of the MIS transistors $T_1$ to $T_{24}$; $LX_{10}$ to $LX_{13}$ are a second group of leads connected to the other output electrodes of the MIS transistors $T_1$ to $T_{24}$; $LY_0$ to $LY_2$ are a third group of leads each connected to the gate electrodes of transistors $T_{13}$, $T_{16}$, $T_{19}$ and $T_{22}$, to the gates of $T_{20}$ and $T_{23}$, and to the gates of $T_6$, $T_{12}$, $T_{18}$ and $T_{24}$, respectively; $LY_{10}$ to $LY_{12}$ are a fourth group of leads each connected to the gate electrodes of the MIS transistors as shown; the leads $LY_{10}$ to $LY_{12}$ are connected with $LY_0$ to $LY_2$ respectively through inverters $I_1$ to $I_3$ which are respectively connected to address input terminals $AD_0$ to $AD_2$; and the leads $LX_{10}$ to $LX_{13}$ are connected in common through respective loads $R_1$ to $R_4$ and connected to a voltage supply source terminal $P_1$.

The conventional decoder circuit operates as follows. When transistors $T_{13}$, $T_{16}$, $T_{19}$ and $T_{22}$ operate in response to the supplying of an input signal "1" to the address input terminal $AD_0$, electric currents flow through loads $R_3$ to $R_4$ whereby output signals are generated on leads $LX_4$ to $LX_7$. Therefore, the response speed to the input signal is determined by the high resistance loads $R_3$ to $R_4$.

The way to increase the response speed has been a great problem for integrating such a circuit without increasing power consumption and increasing the size or area to be occupied.

On the other hand, the present invention is directed to an improved decoder circuit in which output signals can be obtained without using any high resistance load to solve the above-mentioned problem.

Figure 2:
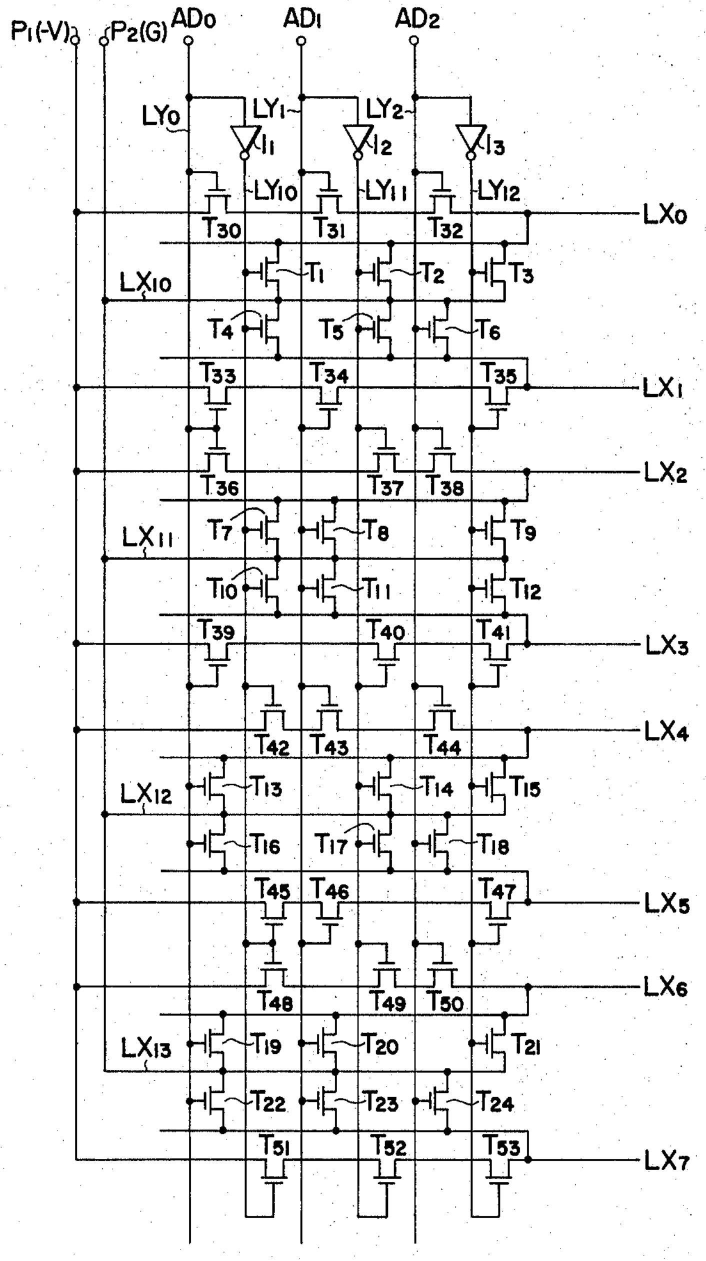
FIG. 2 shows a circuit diagram of a decoder circuit according to the present invention.

FIG. 2 shows a circuit diagram of the decoder circuit according to the present invention, wherein the elements or parts same as or having the same function as those in FIG. 1 are indicated by the same numerals or symbols.

In FIG. 2, $T_{30}$ to $T_{53}$ are MIS transistors each having a gate electrode and a pair of output electrodes; $AD_0$, $AD_1$ and $AD_2$ are address input terminals; $LY_0$, $LY_1$ and $LY_2$ are leads connected to the address lines which are connected with the address input terminals $AD_0$, $AD_1$ and $AD_2$, respectively; $LY_{10}$, $LY_{11}$ and $LY_{12}$ are leads connected with the address input terminals $AD_0$, $AD_1$ and $AD_2$ through inverters $I_1$, $I_2$ and $I_3$, respectively; $LX_0$ to $LX_7$ are decoder output lines; MIS transistors $T_{30}$, $T_{31}$ and $T_{32}$ are connected to the line $LX_0$ in series; an output electrode of $T_{30}$ are connected to a voltage or potential supply source terminal $P_1$; output electrodes of $T_1$, $T_2$ and $T_3$ are connected to the output line $LX_0$; the other electrodes of $T_1$, $T_2$ and $T_3$ are connected to the ground terminal $P_2$ through an earth or ground line $LX_{10}$; and in the same way MIS transistors $T_{33}$ to $T_{53}$ are connected in series between the voltage supply source terminal $P_1$ and output lines or leads $LX_1$ to $LX_7$, respectively, as shown in FIG. 2, MIS transistors $T_1$ to $T_{53}$ may be connected with a proper pattern between the voltage supply source line $P_1$ and the output lines $LX_0$ to $LX_7$ or between the ground lines $LX_{10}$ to $LX_{13}$ and the output lines $LX_0$ to $LX_7$ in order to obtain predetermined output signals. Further, the gate electrodes of MIS transistors $T_1$ to $T_{53}$ may be properly connected to the address lines $LY_0$ to $LY_2$ or inverted address lines $LY_{10}$ to $LY_{12}$.

The operation of the thus combined decoder circuit will now be explained in detail.

Figure 3:
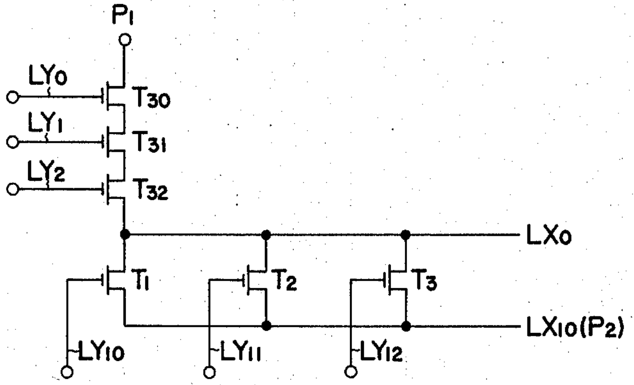
FIG. 3 shows a circuit diagram for explaining the operation principle of the decoder circuit shown in FIG. 2.

FIG. 3 shows a circuit diagram of only a circuit portion for transmitting an output signal to the lead $LX_0$ in order to explain the operation principle of the decoder circuit in FIG. 2.

When input signals corresponding to a "1" level are supplied to address input terminals $AD_0$, $AD_1$ and $AD_2$ in FIG. 2, the signals are also supplied to the gate electrodes of $T_{30}$, $T_{31}$ and $T_{32}$ through leads $LY_0$, $LY_1$ and $LY_2$ to drive transistors $T_{30}$, $T_{31}$ and $T_{32}$. At this time transistors $T_1$, $T_2$ and $T_3$ do not operate since "0" signals are supplied to the lines $LY_{10}$, $LY_{11}$ and $LY_{12}$ through the inverters $I_1$, $I_2$ and $I_3$. Therefore, an output voltage having a value substantially the same as the voltage applied to the voltage supply source terminal $P_1$ can be obtained on line $LX_0$.

When "0" input signals are supplied to the address input terminals $AD_0$, $AD_1$ and $AD_2$, the transistors $T_1$, $T_2$ and $T_3$ are turned on and the transistors $T_{30}$, $T_{31}$ and $T_{32}$ do not operate so as to generate an output voltage having a value substantially the same as the voltage applied to the potential source terminal $P_2$ on line $LX_{10}$.

The same operation is also carried out in other circuit portions in FIG. 2.

Figure 4:
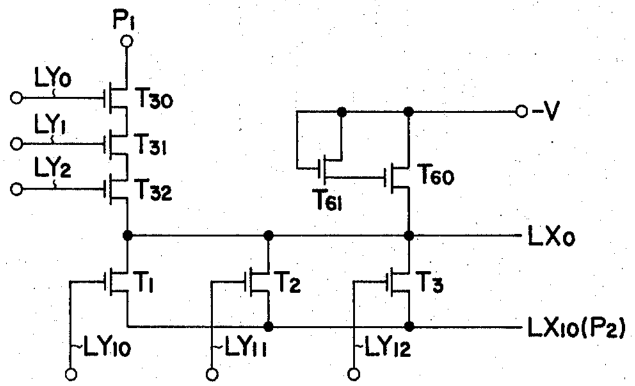
FIG. 4 shows a circuit diagram of another modified decoder circuit according to the present invention.

FIG. 4 shows a circuit diagram of another embodiment according to the present invention, wherein the same substantial parts except MIS transistors $T_{60}$ and $T_{61}$ are as shown in FIG. 3. In FIG. 4, the output electrode of $T_{60}$ is connected to the line $LX_0$, the gate electrode of $T_{60}$ is connected to the output electrode of $T_{61}$, the other output electrodes of $T_{60}$ and $T_{61}$ and the gate electrode of $T_{61}$ are connected to a voltage supply source (−v) in common, whereby the level of the output voltage appearing on the line $LX_0$ can be improved when MIS transistors $T_1$ to $T_3$ operate.

As described above, in the decoder circuit according to the present invention first groups of MIS transistors are connected in series between the first voltage or potential supply source line and output lines, and the gate electrodes of the MIS transistors are connected directly to or indirectly through inverters to lines connected with address input terminals in order to obtain predetermined decoder output signals. Furthermore, second groups of MIS transistors are connected in parallel between a second voltage or potential supply source line and the output lines, and the gate electrodes of the second groups of MIS transistors are also connected directly to or indirectly through the inverters to the address lines.

The decoder circuit according to the present invention does not need any load resistor and, therefore, it is possible to improve the response speed substantially without an increase in power consumption. Also, it is possible to obtain high packaging density of circuit functions through semiconductor integration.

What I claim is:

1. A circuit comprising:

first and second input terminals to which respective voltage levels are applied;

a plurality of output terminals from which output voltage levels are to be obtained;

a plurality of address input terminals to which address signals for selecting said first and second input terminals from which the corresponding voltages supplied thereto are to be coupled to said output terminals;

a plurality of subcircuits each comprising one of said output terminals, a first transistor circuit having an input electrode and an output electrode and including a plurality of first transistors connected in series between said input and output electrodes, each of said first transistors having a control electrode, said input electrode being connected to said first input terminal, said output electrode being connected to said one of the output terminals, and said control electrodes being coupled to said address input terminals, a second transistor circuit having an input electrode and an output electrode and including a plurality of second transistors connected in parallel between said input and output electrodes, each of said second transistors having a control electrode, the input electrode of said second transistor circuit being connected to said second input terminal, the output electrode of said second transistor circuit being connected to said one of said output terminals, and said control electrodes of said second transistor being coupled to said address input terminals;

means, connected between said address input terminals and some of said control electrodes of said first and second transistors, for directly connecting address signals supplied to said address input terminals to some of said control electrodes of the first and second transistors while inverting the address signals and supplying said inverted address signals to the others of said control electrodes of the first and second transistors; and a third transistor circuit having input and output electrodes which are connected between said one of the output terminals and a source of reference voltage.

2. A circuit according to claim 1, wherein said third transistor circuit comprises first and second field effect transistors, the first of which has its input and output electrodes connected between said source of reference voltage and said output terminal and the second of which has its control and input electrodes connected to said source of reference potential and its output electrode connected to the control electrode of the first transistor.

3. A circuit according to claim 1, wherein each of said first and second transistors is a metal insulated gate type field effect transistor.

4. A circuit according to claim 1, wherein prescribed ones of said first and second transistors have their control electrodes electrically connected together.

* * * * *